(12) United States Patent
Nakai et al.

(10) Patent No.: US 6,226,208 B1
(45) Date of Patent: *May 1, 2001

(54) SEMICONDUCTOR MEMORY DEVICE WITH HIERARCHICAL CONTROL SIGNAL LINES

(75) Inventors: Jun Nakai; Yutaka Ikeda, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/455,471

(22) Filed: Dec. 6, 1999

(51) Int. Cl.$^7$ .................................. G11C 7/08; G11C 7/12
(52) U.S. Cl. ........................... 365/191; 365/190; 365/196; 365/207; 365/208; 365/230.03; 365/230.06; 365/202
(58) Field of Search ............................... 365/230.03, 190, 365/191, 196, 207, 208, 230.06, 202

(56) References Cited

U.S. PATENT DOCUMENTS 5,652,730 * 7/1997 Kono et al. ........................... 365/226

FOREIGN PATENT DOCUMENTS 3-266297    11/1991   (JP) .............................. G11C/11/419

* cited by examiner

Primary Examiner—Andrew Q. Tran
(74) Attorney, Agent, or Firm—McDermott, Will & Emery

(57) ABSTRACT

Only one sense signal line for driving a sense amplifier is arranged in each sense amplifier band. Each sub-array is provided with a sub-sense signal generator for generating two sub-sense signals in response to a main sense signal sent from one main sense signal line. The sub-sense signal is applied to the plurality of sense amplifiers corresponding to each sub-array. Since only one main sense signal line is arranged in each sense amplifier, a layout area is reduced. Preferably, a transistor of a first inverter in the sub-sense signal generator is smaller in size than a transistor of a final inverter. Thereby, a significant delay of the sub-sense signal does not occur in a position remote from a source of the main sense signal.

20 Claims, 12 Drawing Sheets

SEMICONDUCTOR MEMORY DEVICE WITH HIERARCHICAL CONTROL SIGNAL LINES

BACKGROUND OF THE INVENTION

1. Field of the Invention

The present invention relates to a semiconductor memory device, and more particularly a semiconductor memory device provided with hierarchical control signal lines.

2. Description of the Background Art

In a semiconductor memory device such as a DRAM (Dynamic Random Access Memory), a large number of sense amplifiers for amplifying minute potential differences occurring on bit line pairs are arranged in a straight line. Each sense amplifier includes a P-channel sense amplifier for raising the voltage on one of the paired bit lines to a power supply voltage, and an N-channel MOS transistor for lowering the voltage on the other bit line to a ground voltage. For operating the sense amplifier, it is required to provide a sense signal for driving the P-channel sense amplifier as well as a sense signal for driving the N-channel sense amplifier. Therefore, a sense signal line for driving the P-channel sense amplifiers and a sense signal line for driving the N-channel sense amplifiers are arranged along the large number of sense amplifiers arranged in a line. These P-channel sense amplifiers are commonly connected to the sense signal line, and all operate simultaneously in response to the sense signal. The N-channel sense amplifiers are commonly connected to the other sense signal line, and all operate simultaneously in response to the sense signal.

As described above, the conventional device is provided with the two sense signal lines arranged along the large number of sense amplifiers arranged in a line so that the device suffers from increase in layout area.

With increase in memory capacity, it may be contemplated to employ a hierarchical structure for the control signal lines, similarly to word lines and bit lines. For employing the hierarchical structure in which the control signal is hierarchically divided into a main signal line and many sub-signal lines, the length of main signal line must be increased with increase in memory capacity. Increase in length of the main signal line results in a problem that signal delay increases with increase in distance to the sub-signal line from a source of the control signal.

SUMMARY OF THE INVENTION

An object of the invention is to provide a semiconductor memory device, of which layout area can be reduced.

Another object of the invention is to provide a semiconductor memory device, in which signal delays on hierarchical control signal lines can be reduced.

According to an aspect of the invention, a semiconductor memory device includes a memory cell array divided into a plurality of blocks. The plurality of blocks are arranged in rows and columns. The memory cell array includes a plurality of sense signal lines for transmitting a main sense signal. Each of the sense signal lines is arranged in the blocks arranged in the single row. Each of the blocks includes a sub-array, a plurality of sense amplifiers and a sub-sense signal generator. The subarray includes a plurality of memory cells arranged in rows and columns, a plurality of first word lines arranged along the row, and a plurality of bit line pairs arranged along the column. The plurality of sense amplifiers correspond to the plurality of bit line pairs, respectively. Each of the sense amplifiers is connected to the corresponding bit line pair, and includes a P-channel sense amplifier responsive to a first sub-sense signal, and an N-channel sense amplifier responsive to a second sub-sense signal. The sub-sense signal generator is connected to corresponding one among the sense signal lines, and is responsive to the main sense signal to generate the first and second sub-sense signals.

In the above semiconductor memory device, only one sense signal line is arranged in the blocks arranged in the single row. Therefore, a layout area required for the sense signal lines can be reduced.

According to another aspect of the invention, a semiconductor memory device includes a memory cell array divided into a plurality of blocks. The plurality of blocks are arranged in rows and columns. The memory cell array includes a plurality of control signal lines for transmitting a main control signal. Each of the control signal lines is arranged in the blocks arranged in the single row. Each of the blocks includes a sub-array, a function circuit and a sub-control signal generator. The sub-array includes a plurality of memory cells arranged in rows and columns, a plurality of word lines arranged along the row and a plurality of bit line pairs arranged along the column. The function circuit is responsive to a sub-control signal to perform an operation necessary for writing/reading data into/from the memory cell. The sub-control signal generator is connected to the control signal line, and is responsive to the main control signal to generate the sub-control signal. The sub-control signal generator includes a first inverter for receiving the main control signal, and a second inverter for supplying the sub-control signal in response to the output signal of the first inverter. The first inverter is formed of a transistor having a smaller size than a transistor forming the second inverter.

In the semiconductor memory device described above, since the transistor forming the first inverter has a smaller size than the transistor forming the second transistor, it is possible to suppress increase in total parasitic capacity of the control signal lines so that the sub-control signal can be produced without a significant delay even in a position remote from the source of the main control signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described in detail with reference to the drawings. In the figures, the same or corresponding portions bear the same reference numbers or characters, and description thereof will not be repeated.

Figure 1:
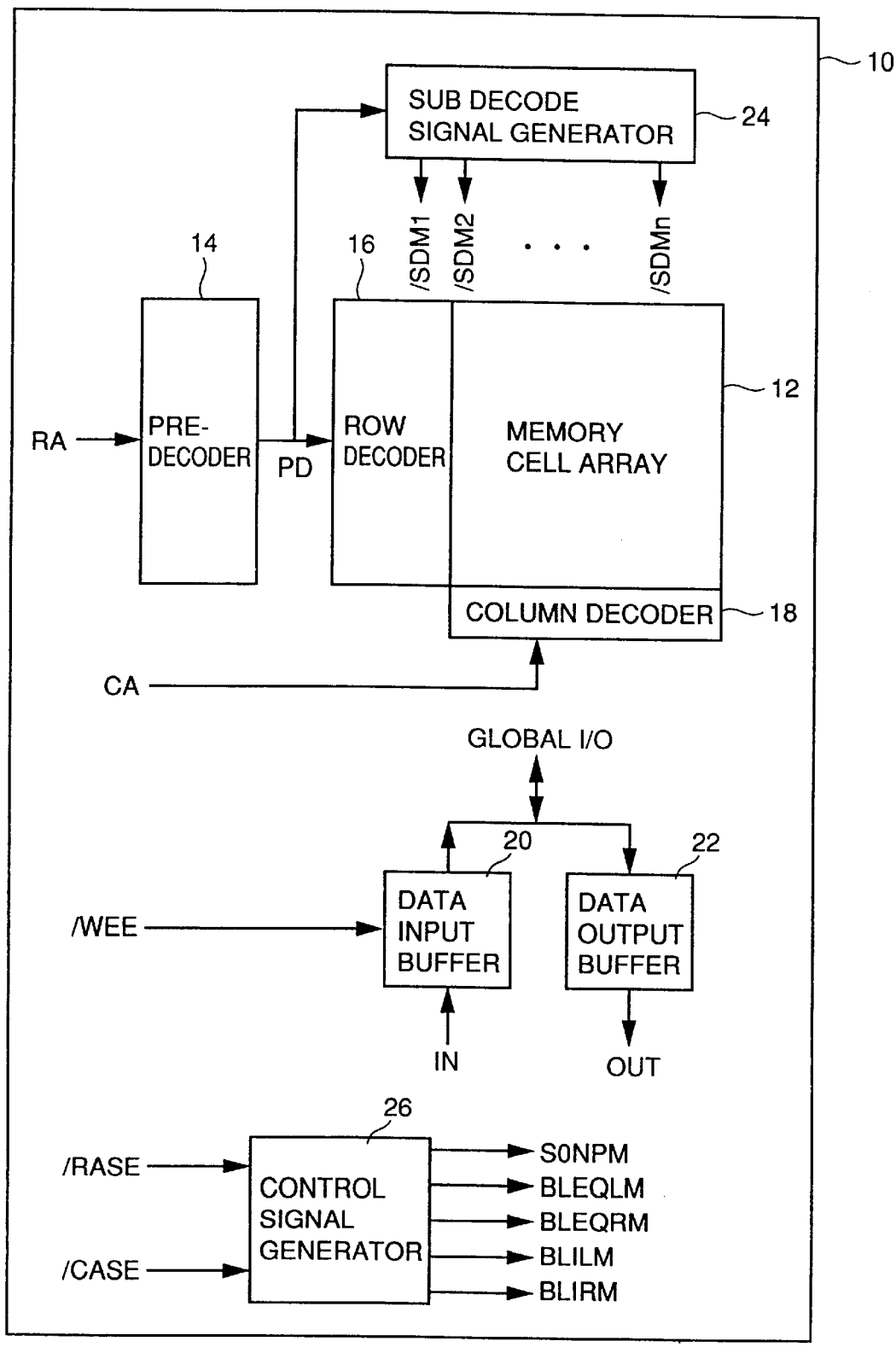
FIG. 1 is a block diagram showing a whole structure of a DRAM according to an embodiment of the invention.

Referring to FIG. 1, a DRAM 10 according to an embodiment of the invention includes a memory cell array 12, a predecoder 14, a row decoder 16, a column decoder 18, a data input buffer 20, a data output buffer 22, a sub-decode signal generator 24 and a control signal generator 26.

A memory cell array 12 includes a plurality of memory cells (see FIG. 3) arranged in rows and columns. Predecoder 14 decodes a row address signal RA to produce a predecode signal PD. Row decoder 16 selects the row in memory cell array 12 in response to predecode signal PD. Column decoder 18 selects the column in memory cell array 12 in response to a column address signal CA.

Data input buffer 20 is responsive to an external write enable signal /WEE, and applies an input data signal, which is to be written into memory cell array 12, onto a global I/O line in memory cell array 12. Data output buffer 22 receives a data signal, which is read from memory cell array 12, via the global I/O line, and issues the received data signal.

Sub-decode signal generator 24 generates a plurality of main sub-decode signals /SDM1–/SDMn in response to predecode signal PD. Control signal generator 26 generates a main sense signal S0NPM, main equalize signals BLEQLM and BLEQRM, and main isolating signals BLILM and BLIRM.

Figure 2:
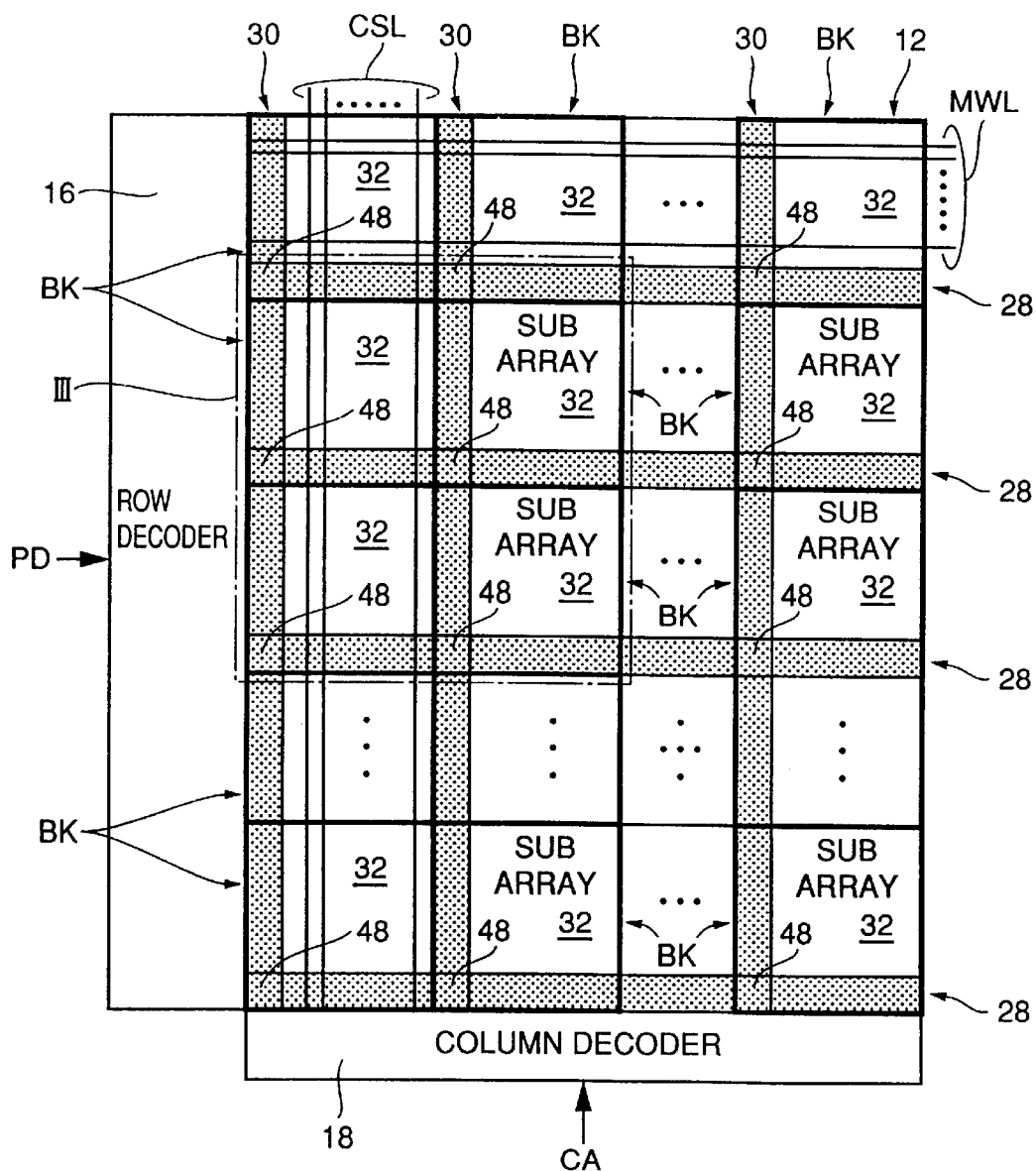
FIG. 2 is a layout diagram showing a structure of a memory cell array shown in FIG. 1.

Referring to FIG. 2, memory cell array 12 is divided into a plurality of blocks BK. These blocks BK are arranged in rows and columns.

DRAM 10 further includes a plurality of main word lines MWL arranged along the row, and a plurality of column select lines CSL arranged along the column. The plurality of main word lines MWL are arranged within the plurality of blocks BL arranged in each row. The plurality of column select lines CSL are arranged within the plurality of blocks BL arranged in each column.

Memory cell array 12 includes a plurality of sense amplifier bands 28 and a plurality of sub-decoder bands 30. Each sense amplifier band 28 extends within the plurality of blocks BK arranged in each row. Each sub-decoder band 30 extends within the plurality of blocks BL arranged in each column. Each block BK includes sub-arrays 32. More specifically, memory cell array 12 is divided into the plurality of sub-arrays 32 by the plurality of sense amplifier bands 28 and the plurality of sub-decoder bands 30.

Row decoder 16 selectively drives main word line MWL in response to predecode signal PD. Column decoder 18 selectively drives column select line CSL in response to column address signal CA.

Figure 3:
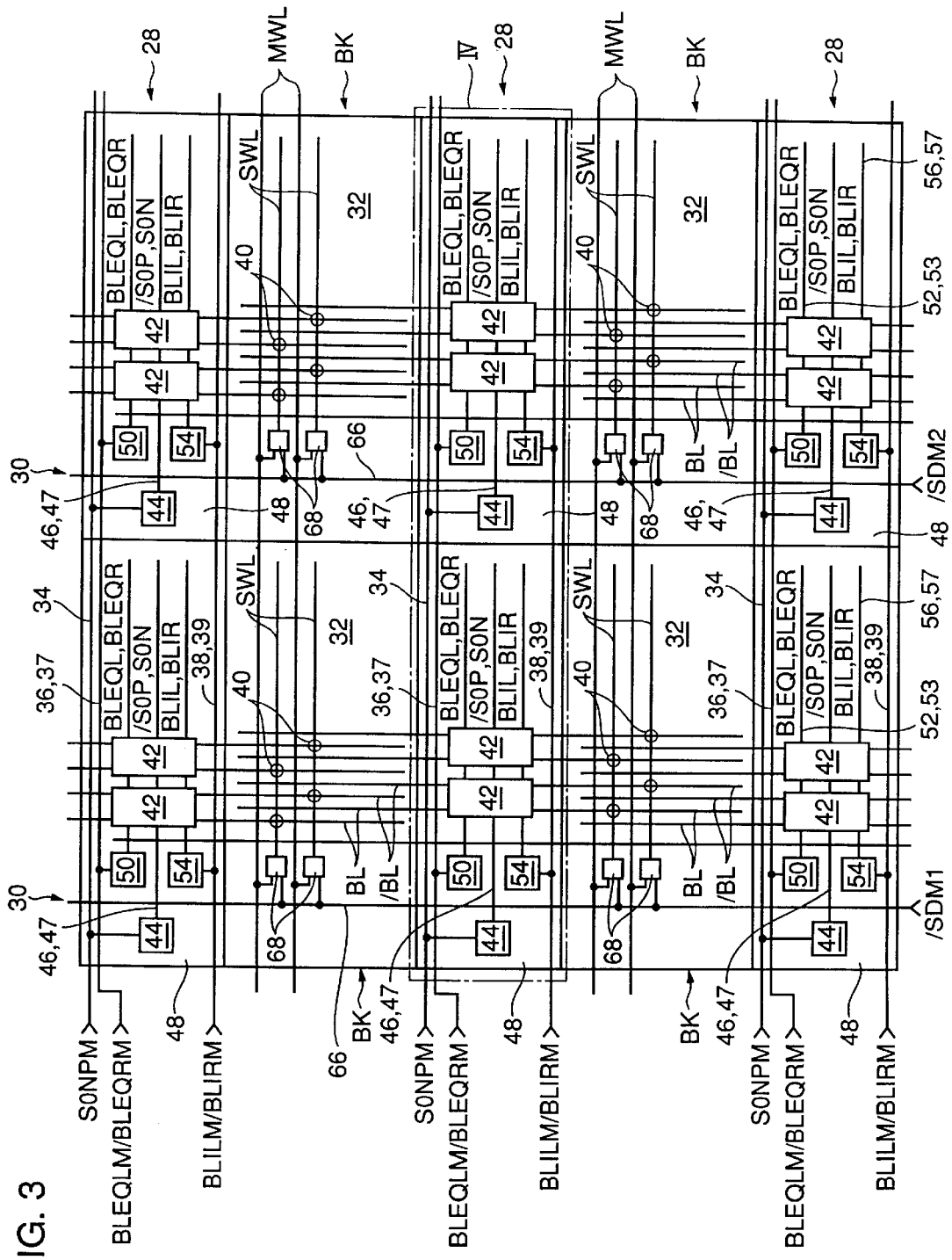
FIG. 3 is a block diagram showing a structure of a portion indicated by III in FIG. 2.
Figure 4:
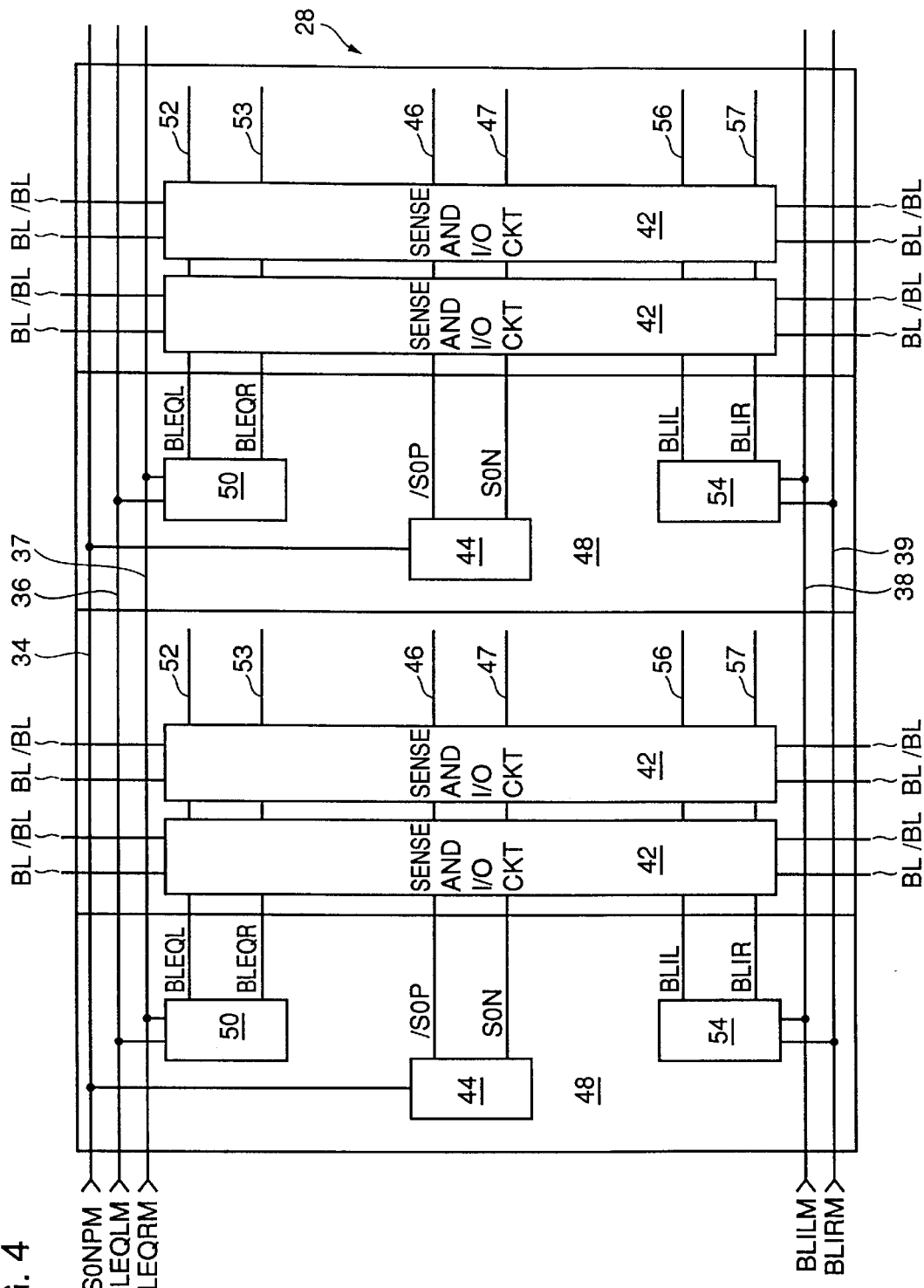
FIG. 4 shows, on an enlarged scale, a portion indicated by IV in FIG. 3.

Referring to FIGS. 3 and 4, memory cell array 12 further includes a plurality of main sense signal lines 34 for transmitting a main sense signal S0NPM. Each main sense signal line 34 is arranged on sense amplifier band 28, and extends through whole memory cell array 12. In a conventional DRAM, two sense signal lines are arranged for each sense amplifier band. In DRAM 10 according to the embodiment, however, only one main sense signal line 34 is arranged for each sense band 28.

Memory cell array 12 further includes a plurality of main equalize signal lines 36 for transmitting main equalize signal BLEQLM, and a plurality of main equalize signal lines 37 for transmitting main equalize signal BLEQRM. Each of main equalize signal lines 36 and 37 is arranged on sense amplifier band 28, and extends through whole memory cell array 12. In FIG. 3, two main equalize signal lines 36 and 37 are represented by one signal line.

Memory cell array 12 further includes a plurality of main isolation signal lines 38 for transmitting main isolating signal BLILM, and a plurality of main isolating signal lines 39 for transmitting main isolating signal BLIRM. Each of main isolating signal lines 38 and 39 is arranged on sense amplifier band 28, and extends through whole memory cell array 12. In FIG. 3, two main equalize signal lines 38 and 39 are represented by one signal line.

Each sub-array 32 includes a plurality of memory cells 40 arranged in rows and columns, a plurality of sub-word lines SWL arranged along the row, and a plurality of bit line pairs BL and /BL arranged along the column. Memory cells 40 are arranged on the crossings between sub-word lines SWL and bit line pairs BL and /BL, respectively. Each memory cell 40 is connected to corresponding sub-word line SWL and corresponding bit line BL or /BL. Memory cell array 12 further includes a plurality of sub-decode signal lines 66 for transmitting main sub-decode signals /SDM1–/SDMn from sub-decode signal generator 24. Each sub-decode signal line 66 is arranged on sub-decode band 30, and extends longitudinally through whole memory cell array 12. Each block BK further includes a plurality of sub-decoders 68 corresponding to the plurality of sub-word lines SWL, respectively. These sub-decoders 68 are arranged in sub-decoder band 30, and are commonly connected to corresponding sub-decoder signal line 30. Each sub-decoder 68 is connected to corresponding main word line MWL. Each sub-decoder drives corresponding sub-word line SWL in response to the voltage on corresponding main word line MWL and main sub-decode signal /SDMi (i=1–n). As can be understood from the above, DRAM 10 has a so-called divided (hierarchical) word line structure.

Each block BK further includes a plurality of sense and I/O circuits 42 corresponding to the plurality of bit line pairs BL and /BL in sub-array 32, respectively. Each sense and I/O circuit 42 is connected to two bit line pairs BL and /BL in neighboring two sub-arrays 32. These sense and I/O circuits 42 are arranged on sense amplifier band 28.

Each block BK further includes a sub-sense signal generator 44 which is connected to corresponding one main sense signal line 34, and generates sub-sense signals /S0P and S0N in response to main sense signal S0NPM, a sub-sense signal line 46 for transmitting sub-sense signal /S0P, and a sub-sense signal line 47 for transmitting sub-sense signal /S0N. Sub-sense signal generator 44 is arranged in a crossing region 48 between sense amplifier band 28 and sub-decoder band 30. Sub-sense signal lines 46 and 47 are arranged in sense amplifier band 28, and are commonly connected to the plurality of sense and I/O circuits 42 in block BK. In FIG. 3, two sub-sense signal lines 46 and 47 are represented by one signal line.

Each block BK further includes a sub-equalize signal generator 50 which is connected to corresponding two main equalize signal lines BLEQLM and BLEQRM, and generates sub-equalize signals BLEQL and BLEQR in response to main equalize signals BLEQLM and BLEQRM, respectively, a sub-equalize signal line 52 for transmitting sub-equalize signal BLEQL, and a sub-equalize signal line 53 for transmitting sub-equalize signal BLEQR. Sub-equalize signal generator 50 is arranged in crossing region 48. Accordingly, the plurality of sub-equalize signal generators 50 arranged on sense amplifier band 28 are commonly connected to the corresponding two main equalize signal lines 36 and 37. Sub-equalize signal lines 52 and 53 are arranged in sense amplifier band 28, and are connected to all sense and I/O circuits 42 in corresponding block BK. In FIG. 3, two sub-sense signal lines 52 and 53 are represented by one signal line.

Each block BK further includes a sub-isolating signal generator 54 for generating sub-isolating signals BLIL and BLIR in response to main isolating signals BLILM and BLIRM, respectively, a sub-isolating signal line 56 for transmitting sub-isolating signal BLIL, and a sub-isolating signal line 57 for transmitting sub-isolating signal BLIR. Sub-isolating signal generator 54 is arranged in crossing region 48. Therefore, the plurality of sub-isolating signal generators 54 arranged on each sense amplifier band 28 are commonly connected to corresponding two main isolating signal lines 38 and 39. Sub-isolating signal lines 56 and 57 are arranged in sense amplifier band 28, and are connected to all sense and I/O circuits 42 in corresponding block BK. In FIG. 3, two sub-isolating signal lines 56 and 57 are represented by one signal line.

Figure 5:
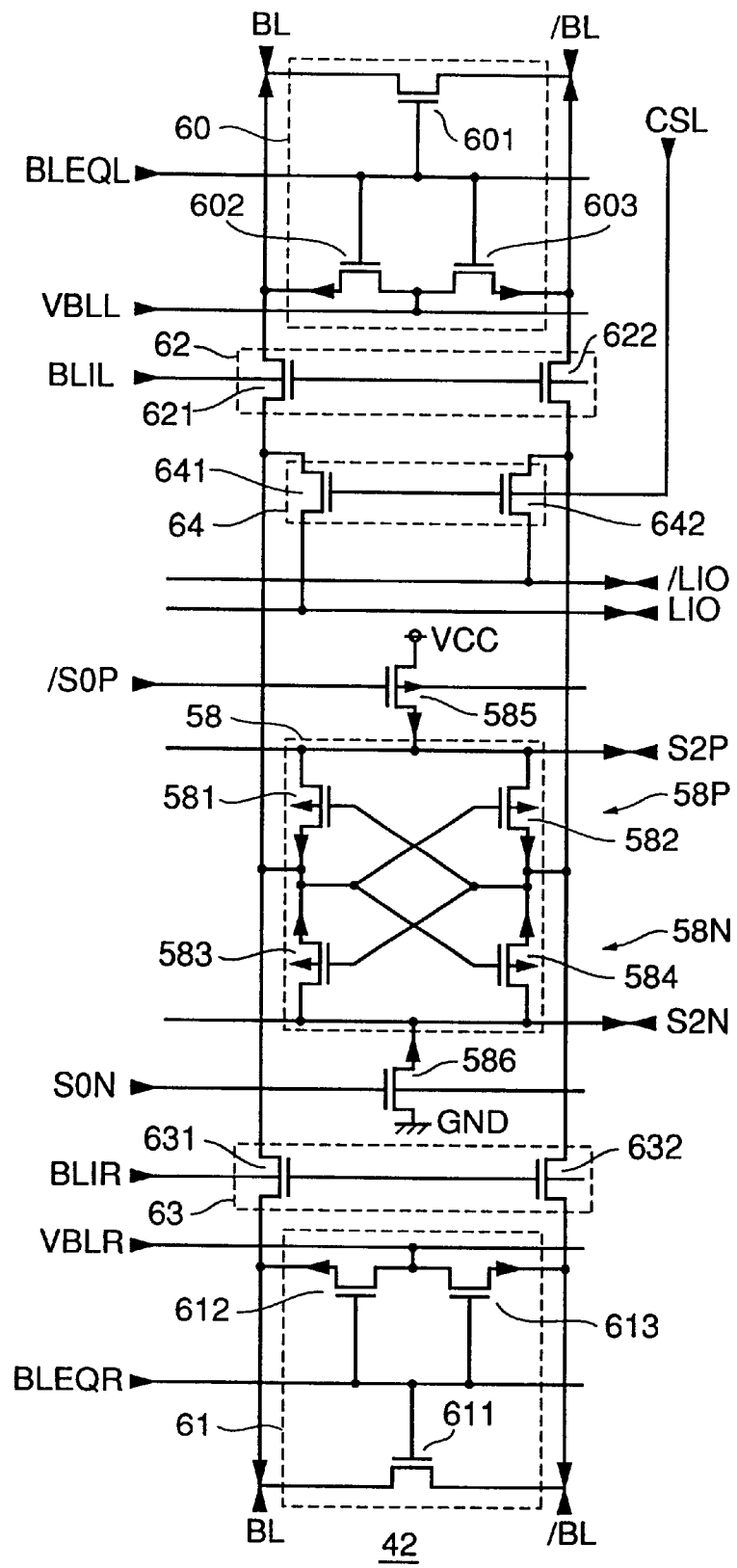
FIG. 5 is a circuit diagram showing a structure of a sense and I/O circuit in FIGS. 3 and 4.

Referring to FIG. 5, each sense and I/O circuit 42 includes a sense amplifier 58 which amplifies a minute potential difference occurring on bit line pair BL and /BL, an equalize circuit 60 which equalizes the voltages on bit line pair BL and /BL located on an upper side in FIG. 5, an equalize circuit 61 which equalizes the voltages on bit line pair BL and /BL on the lower side in FIG. 5, a switching circuit 62 for isolating bit line pair BL and /BL on the upper side from sense amplifier 58, a switching circuit 63 for isolating bit line pair BL and /BL on the lower side from sense amplifier 58, and a column select gate 64 for selecting and connecting bit line pair BL and /BL to local I/O line pair LIO and /LIO.

Sense amplifier 58 includes a P-channel sense amplifier 58P and an N-channel sense amplifier 58N. P-channel sense amplifier 58P includes P-channel MOS transistors 581 and 582 which are mutually connected. N-channel sense amplifier 58N includes N-channel MOS transistors 583 and 584 which are mutually connected. Transistors 581 and 582 have sources connected to a sense amplifier drive line S2P. Transistors 583 and 584 have sources connected to a sense amplifier drive line S2N. The drains of transistors 581 and 583 as well as the gates of transistors 582 and 584 are connected to bit line BL. The drains of transistors 582 and 584 as well as the gates of transistors 581 and 583 are connected to bit line /BL. Sense amplifier drive line S2P is connected to a drive (P-channel MOS) transistor 585 which is turned on in response to sub-sense signal /S0P. Sense amplifier drive line S2N is connected to a drive (N-channel MOS) transistor 586 which is turned on in response to sub-sense signal S0N. Therefore, P-channel sense amplifier 58P operates in response to sub-sense signal /S0P, and thereby raises the higher voltage between voltages on paired bit lines BL and /BL to power supply voltage VCC. N-channel sense amplifier 58N operates in response to sub-sense signal S0N, and thereby lowers the lower voltage between voltages on paired bit lines BL and /BL to ground voltage GND.

Equalize circuit 60 includes N-channel MOS transistors 601–603, and is responsive to sub-equalize signal BLEQL to precharge bit line pair BL and /BL to a predetermined voltage VBLL (usually, equal to an intermediate voltage of VCC/2) and equalize the voltages on bit line pair BL and /BL. Equalize circuit 61 includes N-channel MOS transistors 611–613, and is responsive to sub-equalize signal BLEQR to precharge bit line pair BL and /BL to a predetermined voltage VBLR (usually, equal to intermediate voltage of VCC/2) and equalize the voltages on bit line pair BL and /BL.

Switching circuit 62 is connected between bit line pair BL and /BL on the upper side in FIG. 5 and sense amplifier 58, and includes N-channel MOS transistors 621 and 622. Switching circuit 62 isolates bit line pair BL and /BL on the upper side from sense amplifier 58 in response to subisolating signal BLIL. Switching circuit 63 is connected between bit line pair BL and /BL on the lower side in FIG. 5 and sense amplifier 58, and includes N-channel MOS transistors 631 and 632. Switching circuit 63 isolates bit line pair BL and /BL on the lower side from sense amplifier 58 in response to sub-isolating signal BLIR. As can be seen from the above, sense amplifier 58 is shared by two bit line pairs BL and /BL.

Column select gate 64 is connected between bit line pair BL and /BL and local I/O line pair LIO and /LIO, and includes N-channel MOS transistors 641 and 642. Transistor 641 is connected between bit line BL and local I/O line LIO. Transistor 642 is connected between bit line /BL and local I/O line /LIO. The gates of transistors 641 and 642 are commonly connected to column select line CSL. Column select gate 64 connects bit line pair BL and /BL to local I/O line pair LIO and /LIO in response to the column select signal applied from column decoder 18 via column select line CSL. Local I/O line pair LIO and /LIO extends over sense amplifier band 28, although not shown in FIGS. 2 to 4. Local I/O line pair LIO and /LIO is connected to the global I/O line pair via a transfer gate (not shown). The transfer gate is usually arranged in crossing region 48. The global I/O line pair usually extends over sub-decoder band 30.

Brief description will now be given on data reading operation.

First, bit line pairs BL and /BL are precharged and equalized to predetermined voltages VBLL and VBLR by equalize circuits 60 and 61. In this operation, paired bit lines BL and /BL are both connected to sense amplifier 58.

Then, one of bit line pairs BL and /BL is isolated from sense amplifier 58 by switching circuit 62 or 63.

When one of sub-word lines SWL rises subsequently, data is read from corresponding memory cell 40 onto bit line pair BL and /BL so that a minute potential difference occurs on bit line pair BL and /BL.

Then, sense amplifier 58 amplifies this potential difference so that the higher voltage between those on bit lines BL and /BL is raised to power supply voltage VCC, and the lower voltage between those is lowered to ground voltage GND.

When column select line CSL lowers subsequently, bit line pair BL and /BL is connected to local I/O line pair LIO and /LIO by column select gate 64. Therefore, the data amplified and latched by sense amplifier 58 is transferred onto local I/O line pair LIO and LIO via column select gate 64. The data thus transferred is applied to data output buffer 22 via the global I/O line pair, and is output therefrom.

Figure 6:
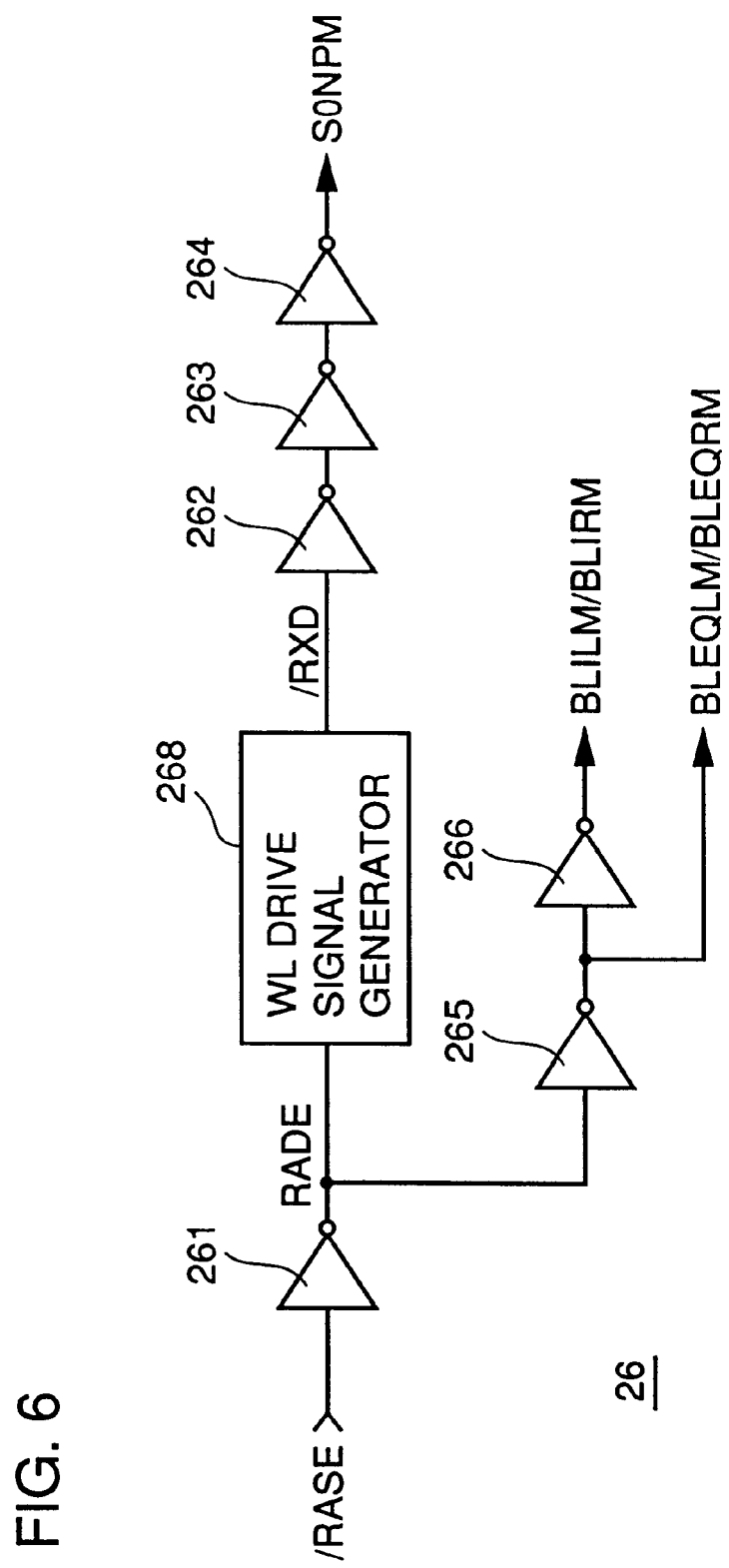
FIG. 6 is a block diagram showing a structure of a control signal generator shown in FIG. 1.

Referring to FIG. 6, control signal generator 26 shown in FIG. 1 includes inverters 261–266, and a word line drive signal generator 268.

Figure 7:
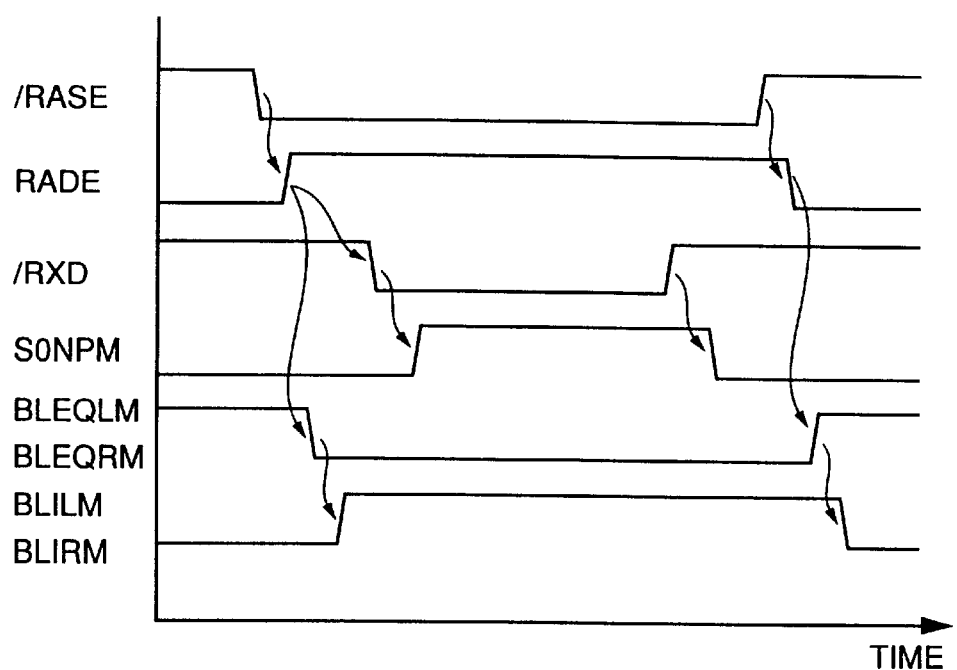
FIG. 7 is a timing chart showing an operation of the control signal generator shown in FIG. 6.

Referring to FIG. 7, inverter 261 generates a control signal RADE in response to external row address strobe signal /RASE. Word line drive signal generator 268 generates a word line drive signal /RXD in response to control signal RADE. Word line drive signal /RXD is activated upon elapsing of a predetermined period after activation of control signal RADE, and will be deactivated upon elapsing of a predetermined period after its own activation. Word line drive signal /RXD is a signal for driving main word line MWL, and is applied to row decoder 16.

Inverters 262–264 generate main sense signal S0NPM in response to word line drive signal /RXD. In a conventional DRAM, two sense signals are generated for activating P- and N-channel sense amplifiers. In contrast to this, only one main sense signal S0NPM is generated in DRAM 10 of this embodiment.

Inverter 265 generates main equalize signal BLEQLM in response to control signal RADE. Inverter 266 generates main isolating signal BLILM in response to main equalize signal BLEQLM. A circuit which is the same as the above is provided for generating main equalize signal BLEQRM and main isolating signal BLIRM.

Figure 8:
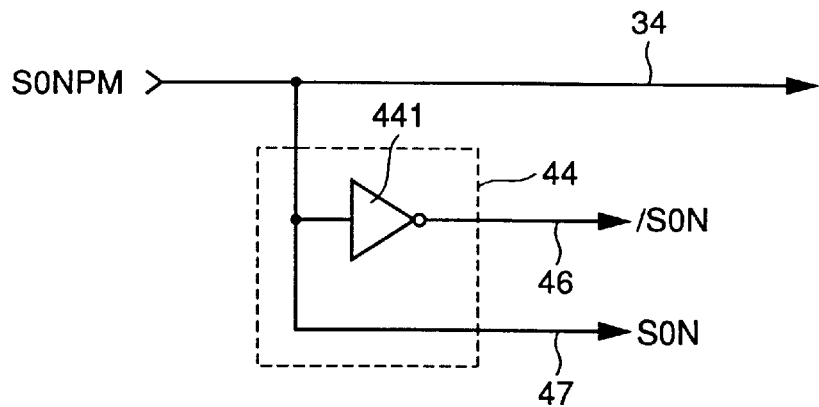
FIG. 8 is a circuit diagram showing by way of example a sub-sense signal generator shown in FIGS. 3 and 4.

Referring to FIG. 8, sub-sense signal generating circuit 44 includes an inverter 441. Main sense signal line 34 is connected to the input of inverter 441, and the output of inverter 441 is connected to a sub-sense signal line 46. Main sense signal line 34 is connected to sub-sense signal line 47. Inverter 441 supplies sub-sense signal /S0P onto sub-sense signal line 46 in response to main sense signal S0NPM. Main sense signal S0NPM is supplied, as sub-sense signal S0N, onto sub-sense signal line 47 as it is.

In the embodiment described above, only one main sense signal line 34 is arranged in sense amplifier band 28 and extends through whole memory cell array 12, and two sub-sense signals /S0P and S0N which are required for activating sense amplifier 58 are generated in each sub-array 32. In the conventional DRAM, two sense signal lines are arranged in each sense amplifier band, and are directly connected to all the sense amplifiers arranged in the same sense amplifier band. According to DRAM 10 of this embodiment, however, only one main sense signal line 34 is arranged in each sense amplifier band 28. Therefore, a layout area required for the sense signal lines can be reduced.

As the memory capacity increases, the size of memory cell array 12 increases and, therefore, main sense signal line 34 must be long. As main sense signal line 34 increases in length, sub-sense signal generators 44 which are connected to the one main sense signal line 34 increase in number. Therefore, a load of main sense signal line 34 increases so that a large delay of sub-sense signals /S0P and S0N occurs in sub-sense signal generator 44 located in the position remote from the source (control signal generator 26) of main sense signal S0NPM.

Figure 9:
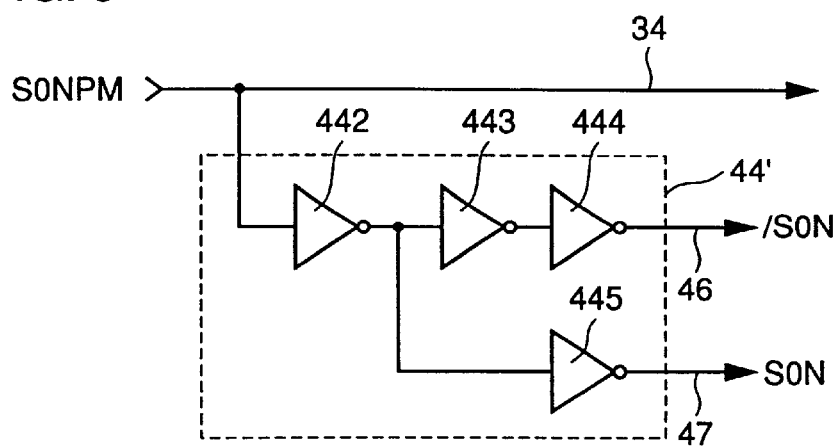
FIG. 9 is a circuit diagram showing another example of the sub-sense signal generator shown in FIGS. 3 and 4.

For overcoming the above disadvantage, a sub-sense signal generator 44' shown in FIG. 9 may be used instead of sub-sense signal generator 44 shown in FIG. 8. Sub-sense signal generator 44' includes inverters 442–445. Main sense signal line 34 is connected to the input of inverter 442. Inverter 442 receives main sense signal S0NPM. Inverter 443 receives the output signal of inverter 442. Inverter 444 receives the output signal of inverter 443, and supplies sub-sense signal /S0P onto sub-sense signal line 46. Inverter 445 receives the output signal of inverter 442, and supplies sub-sense signal S0N onto sub-sense signal line 47.

Figure 10:
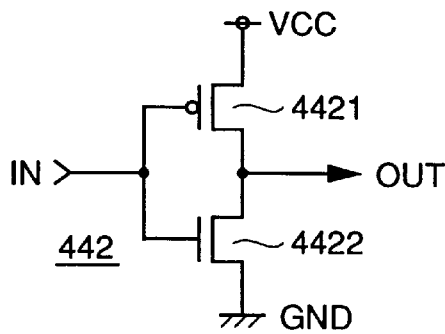
FIG. 10 is a circuit diagram showing a structure of a first inverter in the sub-sense signal generator shown in FIG. 9.
Figure 11:
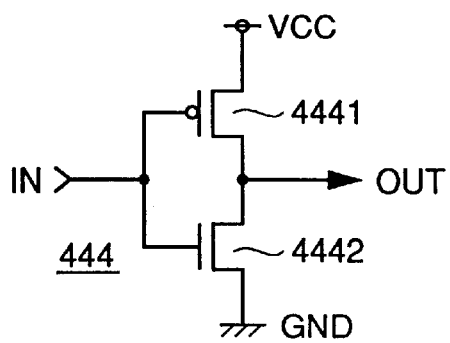
FIG. 11 is a circuit diagram showing a structure of a final inverter in the sub-sense signal generator shown in FIG. 9.
Figure 12:
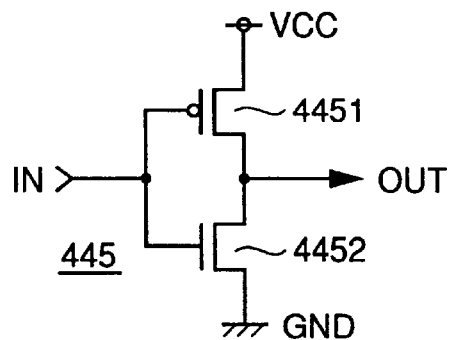
FIG. 12 is a circuit diagram showing a structure of another final inverter in the sub-sense signal generator shown in FIG. 9.

Referring to FIG. 10, inverter 442 at the first stage in sub-sense generator 442 includes a P-channel MOS transistor 4421 and an N-channel MOS transistor 4422. Referring to FIG. 11, inverter 444 at the final stage includes a P-channel MOS transistor 4441 and an N-channel MOS transistor 4442. Referring to FIG. 12, the other inverter 445 at the first stage includes a P-channel MOS transistors 4451 and an N-channel MOS transistor 4452.

The size of each of transistors 4421 and 4422 forming inverter 442 is smaller than those of transistors 4441 and 4442 forming inverter 444 and those of transistors 4451 and 4452 forming inverter 445. For example, transistor 4421 has a gate width of 6 $\mu$m, and each of transistors 4441 and 4451 has a gate width of 30 $\mu$m. Transistor 4422 has a gate width of 3 $\mu$m, and each of transistors 4442 and 4452 has a gate width of 15 $\mu$m.

Although not particularly restricted, the size of transistor forming inverter 443 is larger than those of transistors 4421 and 4422 forming inverter 442, and is smaller than those of transistors 4441, 4442, 4451 and 4452 forming inverters 444 and 445. For example, P-channel MOS transistor (not shown) forming inverter 443 has a gate width of 10 $\mu$m, and N-channel MOS transistor (not shown) has a gate width of 5 $\mu$tm.

As described above, transistors 4421 and 4422 forming first inverter 442 have small sizes, and therefore have small gate capacities. Therefore, increase in total parasitic capacity of main sense signal line 34 can be suppressed in spite of the fact that many inverters 442 are commonly connected to one main sense signal line 34. As a result, sub-sense signals /S0P and S0N are generated without a large delay even in sub-sense generator 44 which is remote from the source of main sense signal S0NPM.

Since transistors 4441, 4442, 4451 and 4452 forming first inverters 441 and 445 have large sizes, drive transistors 585 and 586 of sense amplifier 58 shown in FIG. 5 are driven to a sufficient extent.

Since many sub-decoders 68 are commonly connected to one sub-decode signal line 66, it is preferable to provide sub-decoder 68 having a structure similar to that of sub-sense signal generator 44' shown in FIG. 9.

Figure 13:
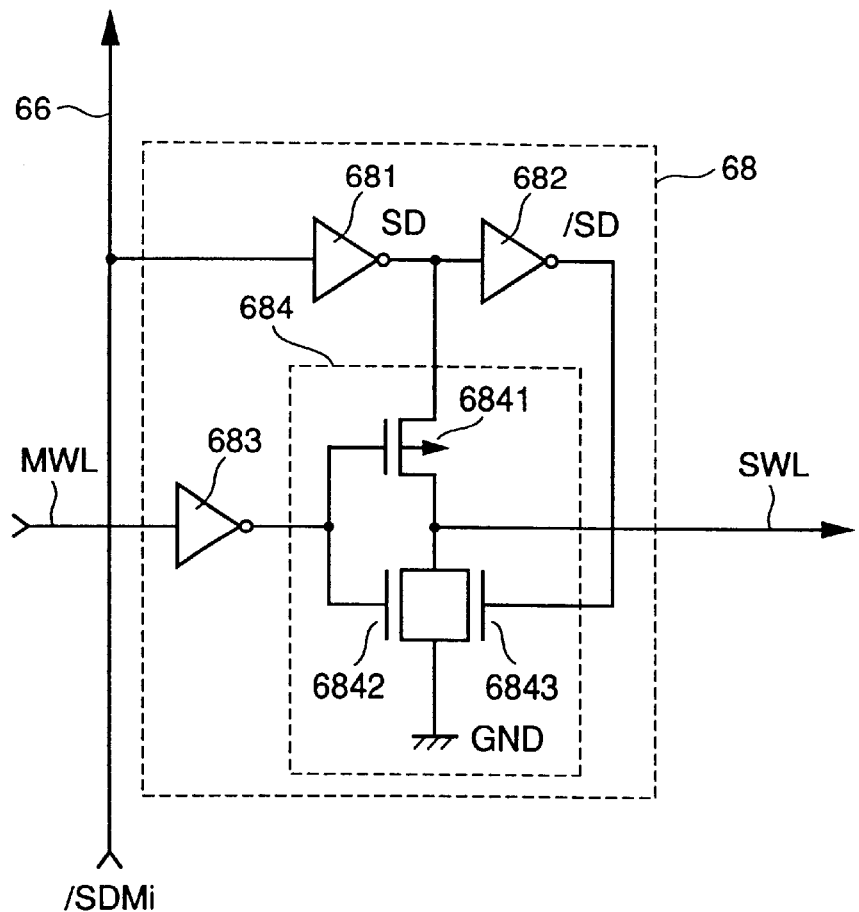
FIG. 13 is a circuit diagram showing a structure of a sub-decoder shown in FIG. 3.

More specifically, each sub-decoder 68 shown in FIG. 13 includes inverters 681–683 and a driver 684. Driver 684 includes P-channel MOS transistor 6841 and N-channel MOS transistors 6842 and 6843. Sub-decode signal line 66 is connected to an input of inverter 681. Inverter 681 receives main sub-decode signal /SDMi, and supplies sub-decode signal SD to driver 684. Inverter 682 receives sub-decode signal SD from inverter 681, and supplies complementary sub-decode signal /SD to the gate of transistor 6843. Main word line MWL is connected to the input of inverter 683. Driver 684 drives sub-word line SWL in response to the output signal sent from inverter 683.

When main word line MWL attains H-level (logical high level) and main sub-decode signal /SDMi attains L-level (logical low level), transistor 6841 is turned on, and transistor 6842 is turned off. Further, inverter 681 supplies sub-decode signal SD at H-level (power supply voltage VCC) to driver 684. Therefore, sub-word line SWL attains H-level.

Even when main word line MWL is at H-level, sub-decode signal SD attains L-level, and complementary sub-decode signal /SD attains H-level if main sub-decode signal /SDMi is at H-level. In this case, therefore, sub-word line SWL does not attain H-level, and is set to L-level by transistor 6843.

Even when main sub-decode signal /SDMi is at L-level, transistor 6841 is off, and transistor 6842 is on if main word line MWL is at L-level. In this case, therefore, sub-word line SWL is at L-level.

Figure 14:
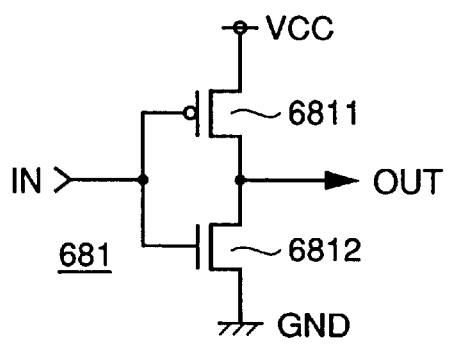
FIG. 14 is a circuit diagram showing a structure of a first inverter in the sub-decoder shown in FIG. 13.

Referring to FIG. 14, inverter 681 includes a P-channel MOS transistor 6811 and an N-channel MOS transistor 6812. Transistors 6811 and 6812 forming inverter 681 have sizes smaller than those of transistors 6841–6843 forming driver 684.

As described above, since transistors 6811 and 6812 forming first inverter 681 in sub-decoder 68 have small sizes, increase in total parasitic capacity of sub-decode signal line 66 is suppressed. Since transistors 6841–6843 forming driver 684 have large sizes, sub-word line SWL is driven to a sufficient extent.

Since many sub-equalize signal generators 50 are commonly connected to each of main equalize signal lines 36 and 37, it is desired that sub-equalize signal generator 50 has a structure similar to that of sub-sense signal generator 44' or sub-decoder 68 shown in FIG. 13.

Figure 15:
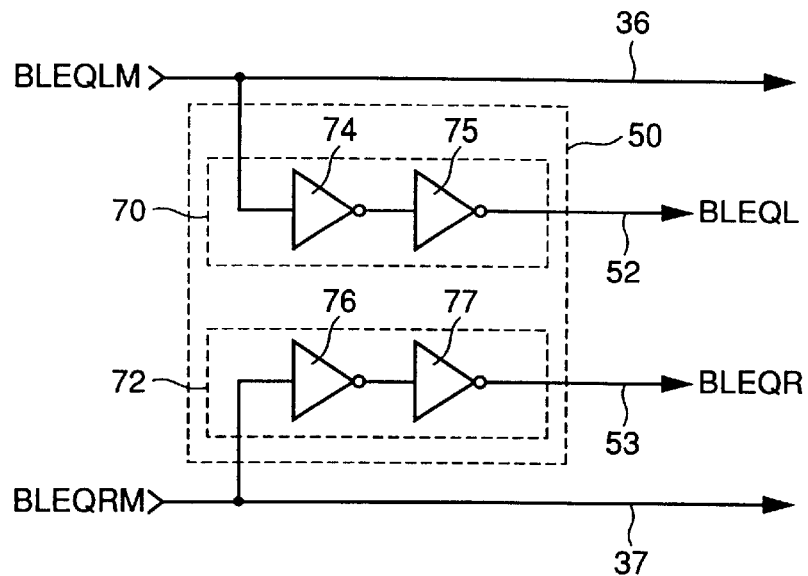
FIG. 15 is a circuit diagram showing a structure of a sub-equalize signal generating circuit shown in FIGS. 3 and 4.

More specifically, sub-equalize signal generator 50 shown in FIG. 15 includes a sub-equalize signal generator 70 which generates sub-equalize signal BLEQL in response to main equalize signal BLEQLM, and a sub-equalize signal generator 72 which generates sub-equalize signal BLEQR in response to main equalize signal BLEQRM. Sub-equalize signal generator 70 includes inverters 74 and 75. Sub-equalize signal generator 72 includes inverters 76 and 77. Main equalize signal line 36 is connected to the input of inverter 74. Inverter 74 receives main equalize signal BLEQLM. Inverter 75 supplies sub-equalize signal BLEQL onto sub-equalize signal line 52 in response to the output signal of inverter 74. Sub-equalize signal generator 72 includes inverters 76 and 77. Main equalize signal line 37 is connected to the input of inverter 76. Inverter 76 receives main equalize signal BLEQRM. Inverter 77 supplies sub-equalize signal BLEQR onto sub-equalize signal line 53 in response to the output signal of inverter 76.

Figure 16:
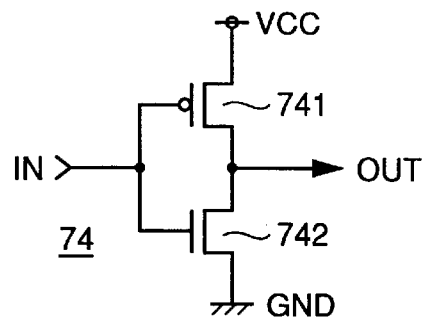
FIG. 16 is a circuit diagram showing a structure of a first inverter in the sub-equalize signal generator shown in FIG. 15.
Figure 17:
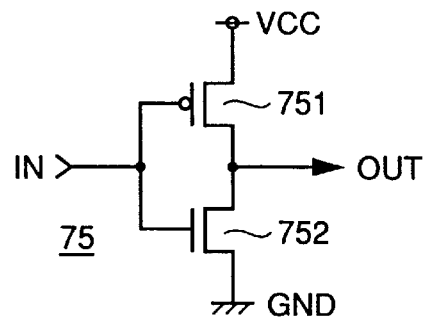
FIG. 17 is a circuit diagram showing a structure of a final inverter in the sub-equalize signal generator shown in FIG. 15.

Referring to FIG. 16, first inverter 74 in sub-equalize signal generator 70 includes a P-channel MOS transistor 741 and an N-channel MOS transistor 742. Final inverter 75 includes a P-channel MOS transistor 751 and an N-channel MOS transistor 752. In this structure, transistors 741 and 742 forming first inverter 74 have sizes smaller than those of transistors 751 and 752 forming final inverter 75.

Sub-equalize signal generator 72 has a structure similar to that of sub-equalize signal generator 70 already described. Although not shown, P- and N-channel MOS transistors forming first inverter 76 in sub-equalize signal generator 72 have smaller sizes than the P- and N-channel MOS transistors forming final inverter 77.

Since the transistors forming first inverters 74 and 76 has small sizes as described above, increase in total parasitic capacity of main equalize signal lines 36 and 37 is suppressed. Since the transistors forming final inverters 75 and 77 have small sizes, equalize circuits 60 and 61 shown in FIG. 5 are driven to a sufficient extent.

Since many sub-isolating signal generating circuits 54 are likewise connected commonly to each of main isolating signal lines 38 and 39, it is desired that sub-isolating signal generating circuit 54 has a structure similar to that of sub-sense signal generator 44' shown in FIG. 9, sub-decoder 68 shown in FIG. 13 or sub-equalize signal generating circuit 50 shown in FIG. 15.

Figure 18:
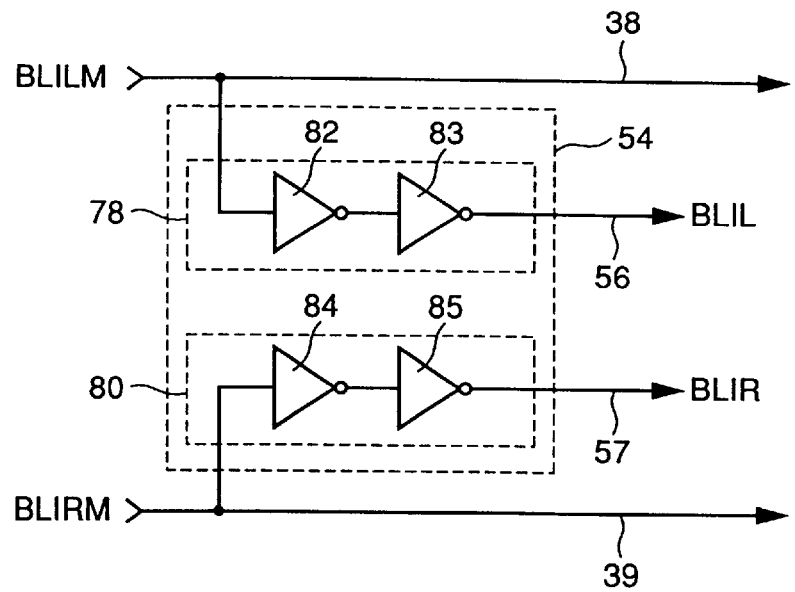
FIG. 18 is a circuit diagram showing a structure of a sub-isolating signal generating circuit in FIGS. 3 and 4.

More specifically, sub-isolating signal generating circuit 54 shown in FIG. 18 includes a sub-isolating signal generator 78 which generates sub-isolating signal BLIL in response to main isolating signal BLILM, and a sub-isolating signal generator 80 which generates sub-isolating signal BLIR in response to main isolating signal BLIRM.

Sub isolating signal generator 78 includes inverters 82 and 83. Main isolating signal line 38 is connected to the input of inverter 82. Inverter 82 receives main isolating signal BLILM. Inverter 83 receives the output signal of inverter 82, and supplies sub-isolating signal BLIL onto sub-isolating signal line 56.

Sub-isolating signal generator 80 includes inverters 84 and 85. Main isolating signal line 39 is connected to the input of inverter 84. Inverter 84 receives main isolating signal BLIRM. Inverter 85 receives the output signal of inverter 84, and supplies sub-isolating signal BLIR onto sub-isolating signal line 57.

Figure 19:
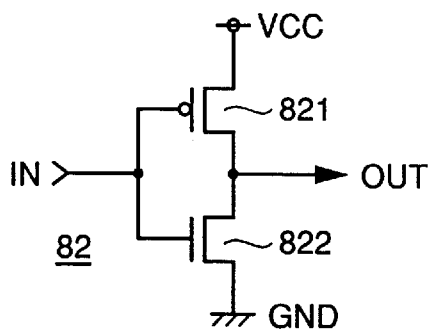
FIG. 19 is a circuit diagram showing a structure of a first inverter in a sub-isolating signal generator in FIG. 18.
Figure 20:
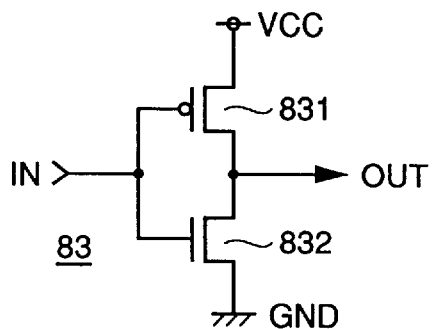
FIG. 20 is a circuit diagram showing a structure of a final inverter in the sub-isolating signal generating circuit shown in FIG. 18.

Referring to FIG. 19, first inverter 82 in sub-isolating signal generator 78 includes a P-channel MOS transistor 821 and an N-channel MOS transistor 822. Referring to FIG. 20, final inverter 83 includes a P-channel MOS transistor 831 and an N-channel MOS transistor 832. In this structure, transistors 821 and 822 forming first inverter 82 have smaller sizes than transistors 831 and 832 forming final inverter 83. Sub-isolating signal generator 80 has a structure similar to that of sub-isolating signal generator 78 already described.

Since the transistors forming first inverter 82 have smaller sizes, increase in total parasitic capacity of main isolating signal lines 38 and 39 can be suppressed. Since the transistors forming first inverters 83 and 85 have large sizes, switching circuits 62 and 63 shown in FIG. 5 are driven to a sufficient extent.

Description has been given by way of example on the sense signal for driving the sense amplifier, the sub-decode signal for driving the sub-decoder, the bit line equalize signal for driving the bit line equalize signal, and the bit line isolating signal for the shared sense amplifier. However, the invention can also be applied to control signals for driving function circuits which perform operations necessary for writing/reading data into/from the memory cells.

Although the DRAM having the divided word line structure has been described, the invention can be applied to the DRAM not having such a structure. In this case, a word line shunt region is provided for connecting the word lines and low-resistance lines together at positions spaced from each other by predetermined distances, instead of sub-decoder band 30.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array divided into a plurality of blocks arranged in rows and columns;
   said memory cell array including a plurality of sense signal lines each arranged in the blocks arranged in the row for transmitting a main sense signal; and
   each of said blocks including:
   a sub-array including a plurality of memory cells arranged in rows and columns, a plurality of first word lines arranged in the rows, and a plurality of bit line pairs arranged in the columns,
   a plurality of sense amplifiers corresponding to the plurality of bit line pairs, each of said sense amplifiers being connected to the corresponding bit line pair, and including a P-channel sense amplifier responsive to a first sub-sense signal and an N-channel sense amplifier responsive to a second sub-sense signal, and
   a sub-sense signal generator connected to corresponding one among said sense signal lines, and being responsive to said main sense signal to generate said first and second sub-sense signals.

2. The semiconductor memory device according to claim 1, wherein
   said sub-sense signal generator includes:
   a first inverter receiving said main sense signal,
   a second inverter responsive to the output signal of said first inverter,
   a third inverter supplying said first sub-sense signal in response to the output signal of said second inverter, and
   a fourth inverter supplying said second sub-sense signal in response to the output signal of said first inverter.

3. The semiconductor memory device according to claim 2, wherein
   a transistor included in said first inverter has a smaller size than transistors included in said third and fourth inverters.

4. The semiconductor memory device according to claim 1, wherein
   said memory cell array further includes:
   a plurality of first bands each extending in the blocks arranged in the row, and
   a plurality of second bands each extending in the blocks arranged in the column;
   said plurality of sense amplifiers are arranged in each of said first bands; and
   said sub-sense signal generator is arranged in a crossing region between each of said first bands and each of said second bands.

5. The semiconductor memory device according to claim 4, wherein
   said memory cell array further includes:
   a plurality of second word lines arranged in the row, and
   a plurality of sub-decode signal lines each arranged in the blocks arranged in the column for transmitting a sub-decode signal; and
   each of said blocks further includes a plurality of sub-decoders arranged in each of said second bands for driving said first word line in response to the voltage on said second word line and said sub-decode signal.

6. The semiconductor memory device according to claim 5, wherein
   each of said sub-decoders includes:
   an inverter receiving said sub-decode signal, and
   a driver driving the corresponding first word line in response to the output signal of said inverter and the voltage on the corresponding second word line.

7. The semiconductor memory device according to claim 6, wherein
   a transistor included in said inverter has a smaller size than a transistor included in said driver.

8. The semiconductor memory device according to claim 1, wherein
   said memory cell array further includes a plurality of equalize signal lines each arranged in the blocks arranged in the row for transmitting a main equalize signal; and
   each of said blocks further includes:
   a plurality of equalize circuits corresponding to said plurality of bit line pairs, and each being connected to the corresponding bit line pair for equalizing the voltages on the corresponding bit line pair in response to a sub-equalize signal, and
   a sub-equalize signal generator connected to corresponding one among said equalize signal lines for generating said sub-equalize signal in response to said main equalize signal.

9. The semiconductor memory device according to claim 8, wherein
   said sub-equalize signal generator includes:
   a first inverter receiving said main equalize signal, and
   a second inverter supplying said sub-equalize signal in response to the output signal of said first inverter.

10. The semiconductor memory device according to claim 9, wherein
    a transistor included in said first inverter has a smaller size than a transistor included in said second inverter.

11. The semiconductor memory device according to claim 1, wherein
    said memory cell array further includes a plurality of first and second isolating signal lines each arranged in the blocks arranged in the row, said first and second isolating signal lines transmitting first and second main isolating signals, respectively; and
    each of said blocks further includes:
    a plurality of first switching circuits corresponding to said plurality of bit line pairs in the same block, and each being connected to the corresponding bit line pair for isolating the corresponding bit line pair from the corresponding sense amplifier in response to a first sub-isolating signal,
    a plurality of second switching circuits corresponding to said plurality of bit line pairs in the block neighboring in the column direction to said block, and each being connected to the corresponding bit line pair for isolating the corresponding bit line pair from the corresponding sense amplifier in response to a second sub-isolating signal,
    a first sub-isolating signal generator connected to corresponding one among said first isolating signal lines for generating said first sub-isolating signal in response to said first main isolating signal, and
    a second sub-isolating signal generator connected to corresponding one among said second isolating signal lines for generating said second sub-isolating signal in response to said second main isolating signal.

12. The semiconductor memory device according to claim 11, wherein
said first sub-isolating signal generator includes:
a first inverter receiving said first main isolating signal, and
a second inverter supplying said first sub-isolating signal in response to the output signal of said first inverter; and
said second sub-isolating signal generator includes:
a third inverter receiving said second main isolating signal, and
a fourth inverter supplying said second sub-isolating signal in response to the output signal of said third inverter.

13. The semiconductor memory device according to claim 12, wherein
a transistor included in said first inverter has a smaller size than a transistor included in said second inverter, and a transistor included in said third inverter has a smaller size than a transistor included in said fourth inverter.

14. The semiconductor memory device according to claim 1, wherein
said sub-sense signal generator includes:
a first inverter receiving said main sense signal, and
a second inverter responsive to the output signal of said first inverter, said first and second inverters supply said first and second sub-sense signals.

15. A semiconductor memory device comprising:
a memory cell array divided into a plurality of blocks arranged in rows and columns;
said memory cell array including a plurality of control signal lines each arranged in the blocks arranged in the row for transmitting a main control signal;
each of said blocks including:
a sub-array including a plurality of memory cells arranged in rows and columns, a plurality of first word lines arranged in the row, and a plurality of bit line pairs arranged in the column,
a function circuit responsive to a sub-control signal to perform an operation necessary for writing/reading data into/from the memory cell, and
a sub-control signal generator connected to said control signal line and being responsive to said main control signal to generate said sub-control signal;
said sub-control signal generator including:
a first inverter receiving said main control signal, and
a second inverter supplying said sub-control signal in response to the output signal of said first inverter; and
a transistor included in said first inverter having a smaller size than a transistor included in said second inverter.

16. The semiconductor memory device according to claim 15, wherein
said function circuit includes:
a plurality of sense amplifiers corresponding to said plurality of bit line pairs, and each being connected to the corresponding bit line pair for operating in response to said sub-control signal.

17. The semiconductor memory device according to claim 15, wherein
said function circuit includes:
a plurality of equalize circuits corresponding to said plurality of bit line pairs, and each being connected to the corresponding bit line pair for equalizing the voltages on the corresponding bit line pair in response to said sub-control signal.

18. The semiconductor memory device according to claim 15, wherein
said function circuit includes:
a plurality of switching circuits corresponding to said plurality of bit line pairs, and each being connected to the corresponding bit line pair for isolating the corresponding bit line pair from a corresponding sense amplifier in response to said sub-control signal.

19. A semiconductor memory device comprising:
a memory cell array divided into a plurality of blocks arranged in rows and columns;
said memory cell array including a plurality of sense signal lines each arranged in the blocks arranged in the row for transmitting a main sense signal; and
each of said blocks including:
a sub-array including a plurality of memory cells arranged in rows and columns, a plurality of first word lines arranged in the rows, and a plurality of bit line pairs arranged in the columns,
a plurality of sense amplifiers corresponding to the plurality of bit line pairs, each of said sense amplifiers being connected to the corresponding bit line pair, and responsive to first and second sub-sense signals, and
a sub-sense signal generator connected to corresponding one among said sense signal lines, and being responsive to said main sense signal to generate said first and second sub-sense signals.

20. The semiconductor memory device according to claim 19, wherein said second sub-sense signal is complementary to said first sub-sense signal.

* * * * *